(12) United States Patent
Tateoka et al.

(10) Patent No.: US 7,843,045 B2
(45) Date of Patent: Nov. 30, 2010

(54) THERMOPLASTIC RESIN COMPOSITION FOR SEMICONDUCTOR, ADHESION FILM, LEAD FRAME, AND SEMICONDUCTOR DEVICE USING THE SAME, AND METHOD OF PRODUCING SEMICONDUCTOR DEVICE

(75) Inventors: Kiyohide Tateoka, Kimitsu (JP); Toshiyasu Kawai, Chiba (JP); Yoshiyuki Tanabe, Ichihara (JP); Tomohiro Nagoya, Chiba (JP); Naoko Tomoda, Ichihara (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 492 days.

(21) Appl. No.: 11/996,142

(22) PCT Filed: Jul. 18, 2006

(86) PCT No.: PCT/JP2006/314185

§ 371 (c)(1), (2), (4) Date: Jan. 18, 2008

(87) PCT Pub. No.: WO2007/010902

PCT Pub. Date: Jan. 25, 2007

(65) Prior Publication Data

US 2009/0091012 A1 Apr. 9, 2009

(30) Foreign Application Priority Data

Jul. 20, 2005 (JP) .............................. 2005-209920
Aug. 31, 2005 (JP) .............................. 2005-251907

(51) Int. Cl.
*C08G 73/10* (2006.01)
*C08G 73/14* (2006.01)
*C08G 69/26* (2006.01)
*C08G 69/40* (2006.01)
*C09J 7/02* (2006.01)
*C09J 177/06* (2006.01)
*C09J 177/10* (2006.01)
*C09J 179/08* (2006.01)
*H01L 23/48* (2006.01)
*H01L 21/02* (2006.01)
*B32B 15/088* (2006.01)

(52) U.S. Cl. .......................... 257/676; 564/464; 528/26; 528/28; 528/38; 528/350; 528/340; 528/342; 528/353; 528/347; 528/348; 257/E21.002; 257/E21.536; 257/E23.037; 438/111; 438/118

(58) Field of Classification Search ......... 528/332–353; 438/111, 118; 257/676; 564/434
See application file for complete search history.

(56) References Cited

U.S. PATENT DOCUMENTS 5,212,279 A * 5/1993 Nomura et al. ............. 528/184
6,040,418 A 3/2000 Yamamoto et al.

FOREIGN PATENT DOCUMENTS

JP 05-105850 4/1993

(Continued)

OTHER PUBLICATIONS

Korean Official Action mailed Jul. 29, 2009, for Application No. 10-2008-7001316.

*Primary Examiner*—Randy Gulakowski
*Assistant Examiner*—Rachel Kahn
(74) *Attorney, Agent, or Firm*—Antonelli, Terry, Stout & Kraus, LLP.

(57) ABSTRACT

The object of the present invention is to provide an adhesion film for semiconductor that is capable of bonding a semiconductor chip to a lead frame tightly at an adhesion temperature lower than that of the adhesion film of a traditional polyimide resin without generation of voids and that can also be used for protection of lead frame-exposed area, a thermoplastic resin composition for semiconductor for use in the adhesive agent layer therein, and a lead frame having the adhesive film and a semiconductor device; and, to achieve the object, the present invention provides a thermoplastic resin composition for semiconductor, comprising a thermoplastic resin obtained in reaction of an amine component containing an aromatic diamine mixture (A) containing 1,3-bis(3-aminophenoxy) benzene, 3-(3'-(3"-aminophenoxy)phenyl)amino-1-(3'-(3"-aminophenoxy)phenoxy)benzene and 3,3'-bis(3"-aminophenoxy)diphenylether, and an acid component (C), an adhesion film for semiconductor using the same, a lead frame having the adhesion film and a semiconductor device using the same.

20 Claims, 2 Drawing Sheets

FOREIGN PATENT DOCUMENTS

| | | |
|---|---|---|
| JP | 11-049855 | 2/1999 |
| JP | 2004-151191 | 5/2004 |
| JP | 2005-209920 | 8/2005 |
| JP | 2005-251907 | 9/2005 |
| JP | 2006-028082 | 2/2006 |
| KR | 2001-0013221 | 2/2001 |
| WO | WO 98/54267 | 12/1998 |

* cited by examiner

THERMOPLASTIC RESIN COMPOSITION FOR SEMICONDUCTOR, ADHESION FILM, LEAD FRAME, AND SEMICONDUCTOR DEVICE USING THE SAME, AND METHOD OF PRODUCING SEMICONDUCTOR DEVICE

TECHNICAL FIELD

The present invention relates to a thermoplastic resin composition favorable for use as a semiconductor mounting material for electronic applications, an adhesion film for semiconductor and a semiconductor device.

BACKGROUND ART

Recently, there are proposed some semiconductor-mounting methods compatible with the demand for increase in performance and density of semiconductor elements and in mounting density. Typical of them are a COL (chip on lead) method of mounting a semiconductor chip on a lead frame having no die pad and a LOC (lead on chip) method of mounting a lead on a semiconductor chip.

Paste adhesive agents of a epoxy-based or acrylic resin and heat-resistant materials carrying a coated adhesive agent are commonly used as adhesive materials for bonding a semiconductor element on lead frame in these methods. However, these adhesives demand heating at higher temperature for an extended period for hardening, and use of them is not favorable from the point of productivity. In addition, these adhesives, which are relatively more hygroscopic, cause problems such as deterioration in the reliability of semiconductor package.

To solve the problems above, proposed is a method of improving productivity by using an adhesion film for semiconductor of polyimide resin that does not demands heating and hardening for an extended period of time (see, for example, Japanese Patent Application Publication No. 5-105850). However, the method demands adhesion at extremely high temperature, which is likely to cause thermal damage in the semiconductor element. On the other hand, it is possible to decrease the temperature of adhesion by lowering the glass transition temperature of the polyimide resin, but, in such a case, the decrease in glass transition temperature leads to deterioration in heat resistance of the polyimide resin at the same time and easier generation of voids during adhesion, and consequently to deterioration in adhesive strength. Further, it may also affect the wire-bonding efficiency and the reflow resistance in the production steps for a semiconductor package, consequently leading to deterioration in reliability of the semiconductor package.

To cope with the recent demand for further increase in density and reduction in the area and thickness of semiconductor packages, also under development are packages in the structure in which only one (semiconductor element-sided) face of the package is sealed and the lead frame exposed on the other face is used as a lead terminal. The package in such a structure is advantageous for reducing the area and thickness, because the lead frame is not sticking out of the sealing resin, but often causes problems such as migration of sealing resin to the rear face of the lead frame during sealing. In contrast, the inventors had found that it was possible to prevent the problems above by protecting the lead frame exposed on the rear face with an adhesion film and removing the layer after sealing, but, in recent popularization of various surface treatments such as coating of an organic film on the lead frame surface, there is still a problem of deterioration in the adhesive strength at the interface between the adhesion film and the lead frame.

SUMMARY OF THE INVENTION

In view of the circumstances above, an object of the present invention is to provide an adhesion film for semiconductor that allows tight adhesion between the lead frame and a semiconductor chip at a bonding temperature lower than that with a traditional polyimide resin without generation of voids and can be used for protection of the lead frame-exposed area, a thermoplastic resin composition for semiconductor used as an adhesive agent layer of the adhesion film, and a lead frame, semiconductor device having the adhesion film and a method of producing a semiconductor device.

After intensive studies to solve the problems above, the inventors have found that it was possible to solve the problems above with an adhesion film (adhesive agent layer) of a resin composition containing a thermoplastic resin prepared in reaction of an amine component containing particular diamines and an acid component, and completed the present invention.

The present invention has the following aspects (1) to (21).

(1) A thermoplastic resin composition for semiconductor, comprising a thermoplastic resin obtained in reaction of an amine component containing an aromatic diamine mixture (A) containing 1,3-bis(3-aminophenoxy)benzene, 3-(3'-(3"-aminophenoxy)phenyl)amino-1-(3'-(3"-aminophenoxy)phenoxy)benzene and 3,3'-bis(3"-aminophenoxy)diphenylether, and an acid component (C).

(2) The thermoplastic resin composition for semiconductor described in (1), wherein the aromatic diamine mixture (A) contains 3-(3'-(3"-aminophenoxy)phenyl)amino-1-(3'-(3"-aminophenoxy)phenoxy)benzene in an amount of 0.01 to 50 wt % and 3,3'-bis(3"-aminophenoxy)diphenylether in an amount of less than 10 wt % with respect to 100 wt % of the mixture (A).

(3) The thermoplastic resin composition for semiconductor described in (1), wherein the amine component further includes a siloxanediamine (B).

(4) The thermoplastic resin composition for semiconductor described in (3), wherein
the amine component contains the siloxanediamine (B) in an amount of 0.01 to 80 mol % with respect to 100 mol % of the amine component.

(5) The thermoplastic resin composition for semiconductor described in (1), wherein the acid component (C) is trimellitic anhydride monochloride.

(6) The thermoplastic resin composition for semiconductor described in (1), further comprising a coupling agent in an amount of 0.1 to 50.0 parts by weight with respect to 100 parts by weight of the thermoplastic resin.

(7) An adhesion film for semiconductor, comprising a support film and an adhesive agent layer made of the thermoplastic resin composition for semiconductor described in (1) formed on one face or both faces of the support film.

(8) The adhesion film for semiconductor described in (7), wherein the contact angle with water of the adhesive agent layer is 50 to 80 degrees.

(9) The adhesion film for semiconductor described in (7), wherein the glass transition temperature of the adhesive agent layer is 150 to 250° C.

(10) The adhesion film for semiconductor described in (7), wherein the temperature that the weight of the adhesive agent layer decreases 5 wt % is 300° C. or higher.

(11) The adhesion film for semiconductor described in (7), wherein the material of the support film is selected from the group consisting of polyimide, polyamide, polysulfone, polyphenylene sulfide, polyether ether ketone, polyarylate, polycarbonate, polyolefin, polyethylene terephthalate, polyethylene naphthalate, polyamide-imide, polyether sulfone and polyether ketone.

(12) The adhesion film for semiconductor described in (7), wherein the thickness of the support film is 5 to 200 μm and the thickness of the adhesive agent layer is 1 to 75 μm.

(13) The adhesion film for semiconductor described in (7), wherein the adhesive agent layer is formed on one face of the support film and a nonadhesive resin layer having a modulus of elasticity of 10 MPa or more at 230° C. is formed on the other face of the support film.

(14) A lead frame having an adhesive film, comprising a lead frame and the adhesion film for semiconductor described in (7) bonded thereto.

(15) A semiconductor device, comprising a lead frame and a semiconductor element bonded mutually by using the adhesion film for semiconductor described in (7).

(16) A semiconductor device having an adhesion film, comprising a lead frame having an inner lead and a die pad, the adhesion film for semiconductor described in (7) bonded onto one face of the lead frame, a semiconductor element bonded onto the die pad of the other face of the lead frame, a wire connecting the semiconductor element and the inner lead to each other, and a sealant layer sealing the other face of the lead frame, the semiconductor element and the wire.

(17) The semiconductor device having an adhesion film described in (16), wherein the die pad and the semiconductor element are bonded to each other via the adhesive agent layer of the adhesion film for semiconductor described in (7).

(18) A semiconductor device, prepared by separating the adhesion film for semiconductor from the semiconductor device having an adhesion film described in (16).

(19) A method of producing a semiconductor device, comprising a step of bonding the adhesion film for semiconductor described in (7) onto one face of a lead frame having an inner lead and a die pad, a step of bonding a semiconductor element onto the die pad of the other face of a lead frame, a step of connecting the semiconductor element and the inner lead to each other with a wire by wire bonding, a step of sealing the other face of the lead frame, the semiconductor element and the wire with a sealant, and a step of separating the adhesion film for semiconductor from one face of the lead frame and the sealant.

(20) The method of producing a semiconductor device described in (19), wherein the lead frame has multiple patterns each containing the die pad and the inner lead, and further comprises a step of dividing the lead frame into two or more semiconductor devices each having a semiconductor element after the step of sealing or the step of separating the adhesion film for semiconductor.

(21) The method of producing a semiconductor device described in (19), wherein the die pad and the semiconductor element are bonded to each other by using the adhesion film for semiconductor described in (7).

With the thermoplastic resin composition for semiconductor according to the present invention and the adhesion film for semiconductor using the same, it is possible to bond the lead frame and a semiconductor chip tightly to each other at a bonding temperature lower than that with a traditional polyimide resin without generation of voids. The lead frame and the semiconductor device having the adhesive film according to the present invention are superior in wire-bonding efficiency, reflow resistance, and reliability.

The adhesion film for semiconductor according to the present invention is favorably used in applications for protection of the exposed region of various surface-treated lead frames, and it is possible to produce a semiconductor device having a structure in which the lead frame exposed on the rear face is used as a lead terminal that is advantageous in increasing density and reducing area and thickness at high processability and productivity.

Therefore, the thermoplastic resin composition for semiconductor according to the present invention would be extremely valuable as a microelectronic material or a semiconductor-mounting material.

This application claims priority based on Japanese patent applications filed by the applicants of the present application, namely Japanese Patent Application Nos. 2005-209920 (filed on Jul. 20, 2005) and 2005-251907 (filed on Aug. 31, 2005), the contents of whose specifications are incorporated herein by reference.

BRIEF DESCRIPTION OF THE DRAWINGS

FIG. 1(a) shows an adhesive agent layer formed on both faces of a support film, and FIG. 1(b) shows an adhesive agent layer formed on one face of a supporting film adhesive agent layer.

DESCRIPTION OF THE PREFERRED EMBODIMENTS

Thermoplastic Resin Composition for Semiconductor According to the Present Invention

The thermoplastic resin composition for semiconductor according to the present invention is characterized by containing a thermoplastic resin prepared in reaction of an amine component including an aromatic diamine mixture (A) containing 1,3-bis(3-aminophenoxy)benzene, 3-(3'-(3"-aminophenoxy)phenyl)amino-1-(3'-(3"-aminophenoxy)phenoxy)benzene and 3,3'-bis(3"-aminophenoxy)diphenylether, and an acid component (C).

The aromatic diamine mixture (A) contains 1,3-bis(3-aminophenoxy)benzene, 3-(3'-(3"-aminophenoxy)phenyl)amino-1-(3'-(3"-aminophenoxy) phenoxy)benzene and 3,3'-bis(3"-aminophenoxy) diphenylether as essential components, but may contain another aromatic diamine additionally. The other aromatic diamine component is not particularly limited, and examples thereof include 1,4-bis(4-aminocumyl)benzene (BAP), 1,3-bis(4-aminocumyl)benzene, 1,4-bis(3-aminophenoxy)benzene, 1,4-bis(4-aminophenoxy)benzene, 2,2-bis[4-(4-aminophenoxy)phenyl]propane (BAPP), 2,2-bis[4-(3-aminophenoxy)

phenyl]propane, bis[4-(3-aminophenoxy)phenyl]sulfone (m-APPS), bis[4-(4-aminophenoxy)phenyl]sulfone, 2,2-bis[4-(4-aminophenoxy)phenyl]hexafluoropropane, and the like; and these compounds may be used alone or in combination of two or more.

For improvement in adhesive strength, the aromatic diamine mixture (A) preferably contains additionally 3-[3'-(3"-aminophenoxy)phenyl]amino-1-(3'-(3"-aminophenoxy)phenoxy)benzene in an amount of 0.01 to 50 wt % with respect to 100 wt % of the aromatic diamine mixture (A), and also 3,3'-bis(3"-aminophenoxy)diphenylether in an amount of less than 10 wt % with respect to 100 wt % of the aromatic diamine mixture (A).

Further, a siloxanediamine (B) may be added as an amine component additionally. The siloxanediamine (B) is not particularly limited, and examples thereof include the siloxanediamines represented by the following General Formula:

(wherein, $R_5$ and $R_8$ each independently represent a bivalent organic group; $R_6$ and $R_7$ each independently represent a monovalent organic group; and m is an integer of 1 to 100).

$R_5$ and $R_8$ in the General Formula above each independently represent, for example, a trimethylene, tetramethylene, phenylene, or toluilene group; $R_6$ and $R_7$ each independently represent, for example, a methyl, ethyl, or phenyl group; and multiple groups $R_6$ and multiple groups $R_7$ may be the same as or different from each other. Commercially available siloxanediamines in which $R_5$ and $R_8$ are both trimethylene groups and $R_6$ and $R_7$ are both methyl groups include LP-7100 (wherein, m is 1), X-22-161AS (wherein, m is approximately 10), X-22-161A (wherein, m is approximately 20), X-22-161B (wherein, m is approximately 30), X-22-161C (wherein, m is approximately 50), and X-22-161E (wherein, m is approximately 100), (all, trade name, manufactured by Shin-Etsu Chemical Co., Ltd.), and these siloxanediamine may be used alone or in combination of two or more.

For improvement in adhesive strength, the amine component preferably contains the siloxanediamine (B) in an amount of 0.01 to 80 mol % with respect to 100 wt % of the amine component.

The acid component (C) is not particularly limited, and examples thereof include mononuclear or polynuclear aromatic dicarboxylic acids, aromatic tricarboxylic acids, aromatic tetracarboxylic acids, the anhydrides and reactive derivatives thereof, and the like.

The aromatic dicarboxylic acid is not particularly limited, if it has two carboxyl groups bound to the aromatic rings. The aromatic ring may be bound to a substituent group unreactive in condensation reaction such as alkoxy, allyloxy, or halogen, a heterocyclic ring, or another aromatic ring via an alkylene, oxygen, carbonyl, or other group. More specific examples thereof include terephthalic acid, isophthalic acid, 4,4'-diphenyletherdicarboxylic acid, 4,4'-diphenylsulfonedicarboxylic acid, 4,4'-diphenyldicarboxylic acid, 1,5-naphthalenedicarboxylic acid, and the like. Among them, terephthalic and isophthalic acids, which are commercially available, are particularly preferable. Examples of the reactive derivatives of aromatic dicarboxylic acid include dichlorides, dibromides, diesters and others of the aromatic dicarboxylic acid, and terephthalic dichloride and isophthalic dichloride are particularly preferable.

The aromatic tricarboxylic acid is not particularly limited, if two of the three carboxyl groups bound to the aromatic rings are bound to vicinal carbon atoms. The aromatic ring may be bound to a substituent group unreactive in condensation reaction such as alkoxy, allyloxy, or halogen, a heterocyclic ring or another aromatic ring via an alkylene, oxygen, carbonyl, or other group. More specific examples thereof include trimellitic acid, 3,3,4'-benzophenonetricarboxylic acid, 2,3,4'-diphenyltricarboxylic acid, 2,3,6-pyridinetricarboxylic acid, 3,4,4'-benzanilidetricarboxylic acid, 1,4,5-naphthalenetricarboxylic acid, 2'-methoxy-3,4,4'-diphenylethertricarboxylic acid, 2'-chlorobenzanilide-3,4,4'-tricarboxylic acid, and the like. Examples of the reactive derivatives of aromatic tricarboxylic acid include the acid anhydrides, halides, esters, amides, and ammonium salts of an aromatic tricarboxylic acid, and typical examples thereof include trimellitic anhydride, trimellitic anhydride monochloride, 1,4-dicarboxy-3-N,N-dimethylcarbamoylbenzene, 1,4-dicarbomethoxy-3-carboxybenzene, 1,4-dicarboxy-3-carbophenoxybenzene, 2,6-dicarboxy-3-carbomethoxypyridine, 1,6-carboxy-5-carbamoylnaphthalene, ammonium salts of an aromatic tricarboxylic acid, for example, with ammonia, dimethylamine, or triethylamine; and the like, and trimellitic anhydride and trimellitic anhydride monochloride are preferable.

The aromatic tetracarboxylic acid is not particularly limited, if it has four carboxyl groups bound to the aromatic rings. The aromatic ring may be bound to a substituent group unreactive in condensation reaction such as alkoxy, allyloxy, or halogen, a heterocyclic ring or another aromatic ring via an alkylene, oxygen, carbonyl, or other group. More specific examples thereof include pyromellitic acid, pyromellitic dianhydride, 3,3',4,4'-benzophenone tetracarboxylic dianhydride, 3,3',4,4'-biphenyltetracarboxylic dianhydride, bis(3,4-dicarboxyphenyl)ether dianhydride, bis(3,4-dicarboxyphenyl)sulfone dianhydride, bis(3,4-dicarboxyphenoxy)diphenylsulfone dianhydride, 2,2-hexafluoroisopropylidene bisphthalate, 2,2-bis[4-(3,4-dicarboxyphenoxy)phenyl]propane dianhydride, oxydiphthalic dianhydride, bisphenol A bistrimellitate dianhydride, 4,4'-(4,4'-isopropylidenediphenoxy)bisphthalic acid dianhydride, 4,4'-[1,4-phenylenebis(1-methylethylidene)]bisphenyl bistrimellitate dianhydride, naphthalenetetracarboxylic dianhydride, ethylene glycol bistrimellitate dianhydride, decamethylene glycol bistrimellitate dianhydride, and the like.

The thermoplastic resin contained in the thermoplastic resin composition for semiconductor in according to the present invention as an essential component is prepared by allowing an amine component containing a component (A) and as needed a component (B), to react with an acid component (C) above. In this reaction, any one of known reaction methods of allowing the diamine and acid components to react with each other may be used, and the various conditions are not particularly limited.

The weight-average molecular weight of the thermoplastic resin is preferably in the range of 20,000 to 130,000, more preferably 30,000 to 100,000, and particularly preferably 40,000 to 70000. A weight-average molecular weight of less than 20,000 may lead to deterioration in adhesive strength because of too high wettability during adhesion, and additionally, to deterioration in heat resistance and mechanical strength, generation of voids, and deterioration of the reflow-cracking resistance of the semiconductor device used. On the other hand, a weight-average molecular weight of over 130, 000 may lead to deterioration in wettability, prohibiting sufficient adhesive strength and also in the processability of the semiconductor device during production.

In addition to the essential component thermoplastic resin, the thermoplastic resin composition for semiconductor according to the present invention preferably contains a coupling agent. The coupling agent added is not particularly limited, and examples thereof include silane-, titanium-, and zircon-based coupling agents, and the like. A silane coupling agent is used particularly preferably, for improving the compatibility of resins and the adhesiveness at the interface thereof.

Examples of the silane coupling agents include 3-glycidoxypropyltrimethoxysilane, 3-glycidoxypropyltriethoxysilane, 3-aminopropyltriethoxysilane, 3-aminopropyltrimethoxysilane, 2-(3,4-epoxycyclohexyl)ethyltrimethoxysilane, 3-isocyanatopropyltriethoxysilane, and the like. The coupling agent is preferably added in an amount of 0.1 to 50.0 parts by weight, preferably 0.5 to 30.0 parts by weight, and particularly preferably 1.0 to 20.0 parts by weight, with respect to 100 parts by weight of the thermoplastic resin obtained in reaction of the amine component and the acid component (C). A blending amount of less than 0.1 parts by weight may lead to deterioration in thermal stability, while an amount of more than 50.0 parts by weight to deterioration in adhesiveness.

In addition a flame-resistant inorganic compound such as antimony trioxide, aluminum hydroxide, or barium borate or an inorganic filler such as silica, alumina, mica, titanium oxide, zirconia, calcium silicate, magnesium hydroxide, magnesium oxide, iron oxide, calcium carbonate, silicon carbide, boron nitride, silver powder, gold powder, copper powder, or nickel powder may be added to the thermoplastic resin composition for semiconductor according to the present invention, in an amount of 70 wt % or less with respect to the total amount of the thermoplastic resin composition for semiconductor according to the present invention. A content of the inorganic filler of more than 70 wt % may lead to deterioration in adhesiveness.

In addition to the compounds above, the thermoplastic resin composition for semiconductor according to the present invention may contain a known filler, stabilizer, pigment, surfactant, solvent, or the like as needed in the range that does not impair the properties of the adhesive agent.

(Adhesion Film for Semiconductor According to the Present Invention)

Figure 1:
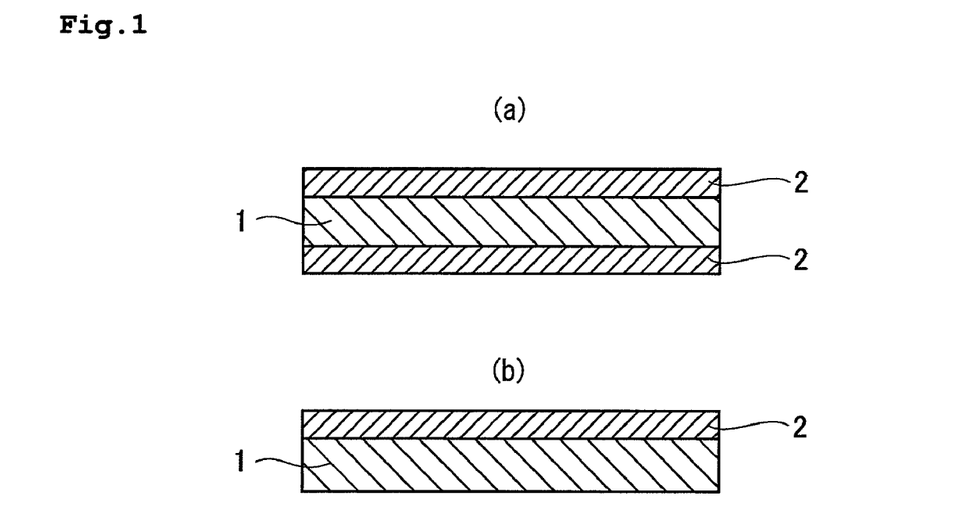
FIG. 1 is a sectional view of the adhesion film for semiconductor according to the present invention in an embodiment.

The adhesion film for semiconductor according to the present invention has one or more adhesive agent layers consisting of the thermoplastic resin composition for semiconductor according to the present invention formed on one side or both faces of a support film. FIG. 1 includes a sectional view (FIG. 1(a)) illustrating an adhesion film having adhesive agent layers 2 formed on both faces of a support film 1, and a sectional view (FIG. 1(b)) illustrating an adhesion film having an adhesive agent layer 2 formed on one face of the support film 1.

The support film is not particularly limited, and the examples thereof include insulative heat-resistant resin films such as of polyimide, polyamide, polysulfone, polyphenylene sulfide, polyether ether ketone, polyarylate, polycarbonate, polyolefin, polyethylene terephthalate, polyethylene naphthalate, polyamide-imide, polyether sulfone, and polyether ketone. A polyimide film is preferable, considering heat resistance, electrical properties, and others.

The raw material for the support film may be selected from materials other than the resins described above, i.e., from the group consisting of copper, aluminum, stainless steel, and nickel. In particular when the adhesion film according to the present invention is used for protection of the lead frame-exposed area, it is possible to make the lead frame and the support film have similar linear expansion coefficients by using the metal above as the support film and to reduce the warp of the lead frame after the adhesion film is adhered to the lead frame. On the other hand for reduction of the warp of the lead frame by using a resin-based support film, the linear thermal expansion coefficient of the support film at 20 to 200° C. is preferably $3.0 \times 10^{-5}/°$ C. or lower, more preferably, $2.5 \times 10^{-5}/°$ C. or lower, and particularly preferably $2.0 \times 10^{-5}/°$ C. or lower; and the heat shrinkage of the resin-based support film when heat at 200° C. for 2 hours is preferably 0.15% or less, more preferably, 0.1% or less, and particularly preferably 0.05% or less. The glass transition temperature of the resin-based support film is preferably 200° C. or higher, more preferably 250° C. or higher, from the viewpoint of heat resistance. By using such a heat-resistant resin film as the support film, it is possible to process it efficiently without softening of the support film in heated steps such as adhesion step, wire-bonding step, sealing step, and separation step. The glass transition temperature of the support film is determined in the tension mode at a heating speed of 10° C./minute and a load of 10 g in a thermomechanical analyzer (for example, manufactured by Seiko Instruments Inc., TMA-120).

The thickness of the support film is not particularly limited, but preferably in the range of 5 to 200 μm, more preferably 20 to 75 μm, and particularly preferably 10 to 50 μm, considering strength, warp, and others.

The surface of the support film is preferably treated, for example, by sand matting, chemical processing, plasma treatment, or corona treatment. In particular, plasma or chemical processing is preferable, considering the adhesion between the supporting film and adhesive agent layer.

The method of forming an adhesive agent layer on support film is not particularly limited, and the layer can be prepared, for example, by coating an adhesive agent varnish, which is prepared by dissolving the resin composition according to the present invention for adhesive agent layer in an organic solvent, on one face or both faces of a support film and removing the solvent by heat treatment.

Examples of the organic solvents include dimethylformamide, dimethylacetamide, N-methyl-2-pyrrolidone, m-cresol, pyridine, cyclohexanone, diethylene glycol dimethylether, triethyleneglycoldimethylether, tetraethylene glycol dimethylether, tetrahydrofuran, dioxane, ethylene glycol monobutylether acetate, ethylcellosolve acetate, toluene, and the like, and these solvents may be used alone or in combination of two or more.

The method of coating the adhesive agent varnish is not particularly limited, but examples thereof include known methods such as roll coating, reverse roll coating, gravure coating, bar coating, comma coating, and the like.

The thickness of the adhesive agent layer formed on the support film is preferably in the range of 1 to 75 μm, more preferably 10 to 30 μm, and particularly preferably 2 to 20 μm. An adhesive agent layer having a thickness of less than 1 μm is less adhesive, while that of more than 75 μm is lower in productivity.

Figure 2:
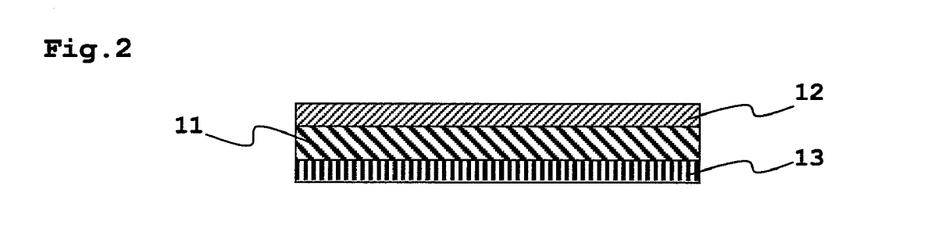
FIG. 2 is a sectional view illustrating the adhesion film for semiconductor according to the present invention in another embodiment.

When the adhesion film according to the present invention is used for protection of lead frame-exposed area, particularly, the contact angle with water of the adhesive agent layer is preferably 50 to 80 degrees, the glass transition temperature of the adhesive agent layer is preferably 150 to 250° C., and the temperature that the weight of the adhesive agent layer decreases 5 wt % is preferably 300° C. or higher. As for the layer structure, the adhesive agent layer 12 is preferably formed on one face of the support film 11 and a resin layer 13 resistant to softening at high temperature on the other face, as shown in FIG. 2, for prevention of curling of the adhesion film associated with the shrinkage in volume of the adhesive agent layer after solvent removal.

The contact angle with water of the adhesive agent layer is more preferably 60 to 80 degrees and particularly preferably 65 to 80 degrees. A contact angle with water of more than 80 degrees leads to increase of the adhesive strength with sealing resin material, making it difficult to separate the film. On the other hand, a contact angle with water of less than 50 degrees may lead to insufficient adhesive strength to the lead frame. The contact angle with water of the adhesive agent layer is influenced by the structure of the amine and acid components, in particular by the structure of the amine component. In the present invention, the separability of the film from sealant and the adhesive strength to the lead frame are balanced by adjusting the contact angle into the range of 50 to 80 degrees by using, for example, 1,3-bis(3-aminophenoxy)benzene as an amine component. In the invention, the contact angle with water of the adhesive agent layer is determined according to JIS R3257, by using a contact angle meter (for example, manufactured by Kyowa Interface Science) under the condition of a water droplet amount of 4 μl, a measurement temperature of 25° C., and a measuring period of 10 seconds or less after a water droplet is placed on the test piece.

The glass transition temperature of the adhesive agent layer is more preferably 150 to 200° C. A glass transition temperature of lower than 150° C. may result in separation at the interface between the adhesive agent layer and the support film when the adhesive agent layer is peeled off from the lead frame and the sealing resin material, and cohesion failure of the adhesive agent layer. It may also result in residual of the adhesive agent on lead frame and sealant, and softening of the adhesive agent layer by the heat in wire-bonding step, leading to wire-connection failure. In addition, the adhesive agent layer may soften by the heat in sealing step, causing troubles such as penetration of the sealant into the area between the lead frame and adhesive agent interlayer. A glass transition temperature of higher than 250° C. may result in insufficient softening of the adhesive agent layer during adhesion, leading to deterioration in the 90° peel strength to the lead frame. The glass transition temperature of the adhesive agent layer is determined by analyzing a single adhesive agent layer in a thermomechanical analyzer (for example, TMA-120, manufactured by Seiko Instruments Inc.) in the tension mode at a heating speed of 10° C./minute and a load of 10 g.

The temperature that the weight of the adhesive agent layer decreases 5 wt % is more preferably 350° C. or higher, particularly preferably 400° C. or higher. When the temperature that the weight of the adhesive agent layer decreases 5 wt % is less than 300° C., outgases may generate by the heat during adhesion of the adhesion film to lead frame or in the wire-bonding step, thus causing staining of the lead frame and wire. The temperature that the weight of the adhesive agent layer decreases 5 wt % is determined by using a differential thermogravimetric analyzer (for example, TG/DTA220, manufactured by Seiko Instruments Inc.) at an initial measurement temperature of 30° C. and a heating speed of 10° C./minute.

As for the layer structure of the adhesion film, it is preferable that the adhesive agent layer having adhesiveness is formed on one face of the supporting film and a nonadhesive resin layer having a modulus of elasticity of 10 MPa or more at 230° C. is formed on the other face. The modulus of elasticity of the nonadhesive resin layer at 230° C. is preferably 10 MPa or more, more preferably 100 MPa or more, and still more preferably 1,000 MPa or more. A resin layer having a modulus of elasticity of less than 10 MPa at 230° C. often softens and adheres to the mold or jig in heated steps such as wire-bonding step. The upper limit of the modulus of elasticity is preferably 2,000 MPa or less and more preferably 1,500 MPa or less. The modulus of elasticity of the resin layer at 230° C. can be determined by using a dynamic viscoelastometer DVE RHEOSPECTOLER (manufactured by Rheology) in the tension mode at a heating speed of 2° C./minute and a measurement frequency of 10 Hz.

The adhesive strength of the nonadhesive resin layer to mold or jig is not particularly limited, if it is so low that it does not adhere to the mold or jig during production, but the peel strength of the resin layer perpendicular to the mold or jig at 25° C. is preferably less than 5 N/m and more preferably less than 1 N/m. The peel strength is determined, for example, after the resin layer is pressed onto a brass mold at a temperature of 250° C. under a pressure of 8 MPa for 10 seconds. The glass transition temperature of the nonadhesive resin layer is preferably 150° C. or higher, more preferably 200° C. or higher, and still more preferably 250° C. or higher, for prevention of softening and adhesion thereof to the mold or jig, for example, in the adhesion step wire-bonding step sealing step and separation step. The upper limit of the glass transition temperature is preferably 350° C. or lower and more preferably 300° C. or lower.

The resin for use in preparing the nonadhesive resin layer is not particularly limited, and both thermoplastic and thermosetting resins may be used. The composition of the thermoplastic resin is not particularly limited, but the resin is preferably a thermoplastic resin having an amide, ester, imide or ether group. In particular, the aromatic polyether amide imide prepared in reaction of 1 mole of the above described amine component and 0.95 to 1.05 mole of the above described acid component is preferable, and the aromatic polyether amide imide prepared in reaction of 1 mole of the above described amine component and 0.98 to 1.02 mole of the above described acid component is more preferable. The composition of the thermosetting resin is also not particularly limited, but, for example, epoxy resins, phenol resins, bis-maleimide resins (for example, bismaleimide resins from a monomer bis(4-maleimide phenyl)methane), and the like are preferable. In addition, a thermoplastic resin and a thermosetting resin may be used in combination. When a thermoplastic resin and a thermosetting resin are used in combination, the thermosetting resin is preferably used in an amount of 5 to 100 parts by weight, more preferably 20 to 70 parts by weight, with respect to 100 parts by weight of the thermoplastic resin.

A filler such as ceramic powder, glass powder, silver powder, copper powder, resin particles or rubber particles, or a coupling agent may be added to the nonadhesive resin layer as needed. When the filler is added, the amount of the filler is preferably 1 to 30 parts by weight, more preferably 5 to 15 parts by weight, with respect to 100 parts by weight of the resin component in the resin layer. The addition amount of the coupling agent is preferably 1 to 20 parts by weight, more preferably 5 to 15 parts by weight, with respect to 100 parts by weight of the resin component in the resin layer.

The method of forming the nonadhesive resin layer on the support film is not particularly limited, but may be similar to the method of forming the adhesive agent layer described above. When the thermosetting resin or the combination of thermoplastic resin and the thermosetting resin is used as the resin forming the nonadhesive resin layer, the modulus of elasticity of the resin layer may be adjusted to 10 MPa or more by hardening the thermosetting resin by heat treatment after varnish coating.

(Lead Frame Having the Adhesion Film According to the Present Invention)

The lead frame having the adhesion film according to the present invention is characterized by being prepared by adhering the adhesion film for semiconductor according to the present invention to a lead frame in which an inner lead, an outer lead, a die pad and others are formed; and more specifically, when the adhesion film for semiconductor according to the present invention is used for adhesion of a semiconductor element with a lead frame, the adhesion film is bonded to the die pad region of the lead frame; while, when the adhesion film for semiconductor according to the present invention is used for protection of the lead frame-exposed area (rear face), the adhesion film is bonded to the non-resin-sealed face of the lead frame. Of course, these cases may be applied simultaneously.

The material for the lead frame is not particularly limited, but, for example, an iron alloy such as 42 alloy, copper, or an copper alloy may be used. Palladium, gold, silver, or the like may be coated on the surface of the lead frame of copper or a copper alloy. Further, an organic component may be coated on the surface of the lead frame for improvement in adhesion force to the sealant, adhesion film, and die bond paste. Copper coated with an organic component is most preferable for improvement in reliability.

The method and condition of bonding the adhesion film is not particularly limited, and any one of known methods and conditions may be used, but, for example, the pressure for bonding the adhesion film for semiconductor onto the lead frame is preferably in the range of 0.5 to 30 MPa, preferably 1 to 20 MPa, and still more preferably 3 to 10 MPa. A bonding pressure of less than 0.5 MPa may result in deterioration in the 90° peel strength between the adhesive agent layer and the lead frame, while a bonding pressure of more than 30 MPa in frequent breakage of the lead frame. It is also preferable to preheat the adhesion film for approximately 5 to 60 seconds before pressurization. The bonding period (pressurization period) is preferably in the range of 0.1 to 60 seconds, more preferably 1 to 30 seconds, and still more preferably 3 to 10 seconds. A bonding period of shorter than 0.1 second may lead to deterioration in the 90° peel strength between the adhesive agent layer and the lead frame, while a bonding period of longer than 60 seconds to deterioration in processability and productivity. The bonding temperature is preferably in the range of 150 to 300° C., more preferably 180 to 250° C., and still more preferably 200 to 250° C. A bonding temperature of lower than 150° C. may lead to deterioration in the 90° peel strength between the adhesive agent layer and the lead frame, while a bonding temperature of higher than 300° C. may lead to degradation of the lead frame.

The 90° peel strength at the interface between the adhesive agent layer of the adhesion film for semiconductor according to the present invention and the lead frame at 25° C., and the 90° peel strength at the interface between the adhesive agent layer and the sealant at 25° C. are both preferably in the range of 10 to 1000 N/m and more preferably 10 to 500 N/m. These peel strength is less than 10 N/m, exfoliation of the adhesion film may occur in the steps from after adhesion to resin sealing, while these peel strength is more than 1000 N/m, it is difficult to separate the adhesion film after resin sealing when the adhesion film is used for protection of the lead frame-exposed area, consequently, leaving the adhesive agent layer of the adhesion film on the lead frame or sealant and causing troubles such as cleavage of the adhesion film. In the invention, the 90° peel strength between the adhesive agent layer and the lead frame at 25° C. is determined by peeling of an adhesion film for semiconductor in the direction perpendicular to the lead frame according to the 90° peeling method of JIS Z0237. Specifically, the 90° peel strength when an adhesion film for semiconductor is peeled off at a rate of 270 to 330 mm, preferably 300 mm, per minute at 25° C. is determined by using a 90° peeling tester (manufactured by Tester Sangyo).

(Semiconductor Device According to the Present Invention)

The semiconductor device according to the present invention is obtained by bonding a lead frame (die pad) and a semiconductor element via the adhesive agent layer of the adhesion film for semiconductor according to the present invention. More specifically, the semiconductor device according to the present invention is prepared, for example, by punching or cutting the adhesion film according to the present invention having an adhesive agent layer formed on one face of the supporting film into a piece of a particular size by using a punching mold or the like, bonding it onto a lead frame or semiconductor element, removing the support film, bonding them in the state in which the adhesive agent layer is held between the lead frame and the semiconductor element under heat and pressure at 150° C. to 300° C. and 0.5 to 10 MPa for 0.1 second to 10 minutes, connecting the lead frame and the semiconductor element for example with gold wires, and sealing the composite with a molding material such as epoxy resin by transfer molding. It is possible to prepare a high-capacity and high-reliability (package cracking-resistant) semiconductor device superior in adhesiveness to the lead frame easily at high processability and yield, by using the adhesion film for semiconductor according to the present invention. If the adhesion film used has an adhesive agent layer on both faces of the support film, it is not necessary to remove the support film.

As described above, the adhesion film for semiconductor according to the present invention is suitable for protection of the lead frame-exposed area in production of a semiconductor device (Non-Lead-Type Package) in the structure in which only one face (semiconductor element-sided) is resin-sealed and the lead frame exposed on the rear face is used as lead terminal.

Figure 3:
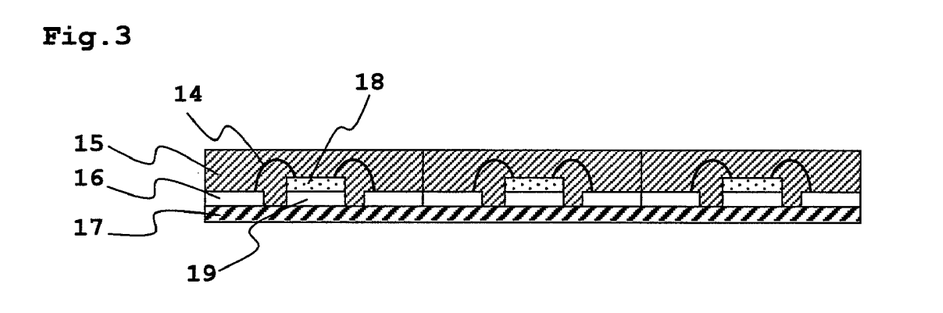
FIG. 3 is a sectional view illustrating the semiconductor device in an embodiment having the adhesion film for semiconductor according to the present invention on the rear face for protection of the expose area of the lead frame.

Typical examples of the semiconductor devices include QFN (QuadFlat Non-leaded Package), SON (Small Outline Non-leaded Package), and the like; and the production method includes, for example, a step of bonding the adhesion film for semiconductor according to the present invention onto one face of a lead frame having an inner lead and a die pad, a step of bonding a semiconductor element onto the die pad of the other face of a lead frame, a step of connecting the semiconductor element and the inner lead with wire by wire bonding, a step of sealing the semiconductor element and wire on the other face of the lead frame with a sealant, and a step of removing the adhesion film for semiconductor from the one face of the lead frame and the sealant. FIG. 3 is a schematic sectional view illustrating a semiconductor device having an adhesion film, before the adhesion film for semiconductor 17 (although the layer structure is not shown, the face in contact with the lead frame is an adhesive agent layer) is separated from the lead frame 16 and the sealant 15; and, in the Figure, 14 represents a bonding wire, 18 represents a semiconductor element and 19 represents a die pad.

Figure 4:
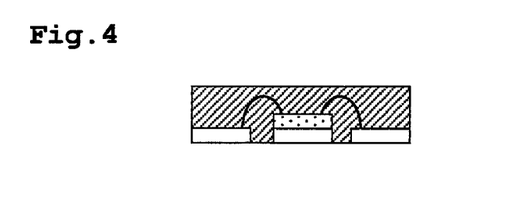
FIG. 4 is a sectional view illustrating the semiconductor device in an embodiment prepared by separating the adhesion film for semiconductor according to the present invention shown in FIG. 3 and dividing it into pieces.

When a lead frame has multiple patterns each having a die pad and an inner lead, it is possible to prepare two or more semiconductor devices each having one semiconductor element by dividing the sealed lead frame, if needed. The step of division may be performed either after the sealing step or after the step of separating the adhesion film for semiconductor. FIG. 4 is a schematic sectional view illustrating the semiconductor device obtained by dividing the semiconductor device having the adhesion film shown in FIG. 3 and removing the adhesion film.

The condition for bonding the adhesion film for semiconductor to the lead frame is the same as the condition described above for the lead frame having the adhesion film for semiconductor according to the present invention. In producing semiconductor devices by using the adhesion film according to the present invention for protection of the lead frame-exposed area (the other face), the adhesion film according to the present invention or a paste adhesive agent such as silver paste may be used for adhesion between the semiconductor element and the die pad of lead frame, but use of the adhesion film according to the present invention is preferable.

The material for the wire used in wire bonding is not particularly limited, but preferably a gold wire or the like. In the wire-bonding step, the wire is connected to the semiconductor element and the inner lead, for example, by heating at 150 to 250° C. for 3 to 60 minutes. The sealant resin is not particularly limited, and any one of known resins may be used, and favorable examples thereof include epoxy resins such as cresol novolak epoxy resin, phenolic novolak epoxy resin, biphenyl diepoxy resin, and naphthol novolak epoxy resin, and the like. Other additives including a filler and a flame-retardant substance such as bromine compound may be added to the sealant. The sealing method is not particularly limited, but generally, sealing is performed by sealing a particular region with a sealant under the condition of a temperature of 150 to 250° C. and a pressure of 10 to 15 MPa for 2 to 5 minutes, and then, hardening the sealant under the condition at 150 to 200° C. for 4 to 6 hours. The temperature when the adhesion film for semiconductor is separated after sealing with a sealant, is preferably in the range of 0 to 250° C., more preferably 10 to 220° C., and particularly preferably 20 to 200° C. A separation temperature of lower than 0° C. often results in residual of the adhesive agent layer on the lead frame and sealant. A greater amount of the residual adhesive agent layer leads to deterioration in appearance and may cause loose contact of the lead frame. Alternatively, a separation temperature of higher than 250° C. may lead to degradation of the lead frame and sealant. The step of separating the adhesion film for semiconductor may be before or after the step of hardening sealant. It is also preferable to leave no adhesive agent layer of the adhesive film on the lead frame and sealant after the adhesion film for semiconductor is separated from the lead frame and sealant. A greater residual amount of the resin leads to deterioration in appearance and may cause loose contact of the lead frame. If the adhesive agent layer remains on the lead frame and sealant, it is preferable to remove it, for example, by mechanical brushing or with a solvent. The solvent for use in removing the residual adhesive agent layer is not particularly limited, and favorable examples thereof include N-methyl-2-pyrrolidone, dimethylacetamide, diethylene glycol dimethylether, tetrahydrofuran, cyclohexanone, methylethylketone, dimethylformamide, and the like.

In summary, a favorable method of producing the semiconductor device according to the present invention having a structure in which the rear face-exposed lead frame is used as a lead terminal includes (1) a step of bonding the adhesion film for semiconductor according to the present invention onto one face of a lead frame having an inner lead and a die pad at 150 to 300° C. and 0.5 to 30 MPa for 0.1 to 60 seconds, (2) a step of mounting a semiconductor element on the die pad of the other face of the lead frame by using an adhesive agent such as silver paste or the adhesion film for semiconductor according to the present invention, (3) a step of connecting the inner lead of the lead frame and the semiconductor element to each other with a wire such as gold wire, by heating at 150 to 250° C. for 3 to 60 minutes, (4) a step of sealing the other face of the lead frame, semiconductor element and wire with a sealant under the condition at 150 to 250° C. and a pressure of 10 to 15 MPa for 2 to 5 minutes, (5) a step of hardening the sealant by heating at 150 to 200° C. for 4 to 6 hours, and (6) a step of separating the adhesion film for semiconductor from one face of the lead frame and the sealant at 0 to 250° C. When the lead frame has multiple patterns each having a die pad and an inner lead, it is divided as needed into two or more semiconductor devices each having one semiconductor element.

Hereinafter, the present invention will be described specifically with reference to Examples, but it should be understood that the present invention is not limited to the following Examples in the scope of the invention. In the following Examples, "parts" means "parts by weight", and "%" means "wt %".

EXAMPLES

Synthesis of Thermoplastic Resin (Synthesis of Thermoplastic Resin (A-1))

In a 5-liter polymerization reactor equipped with a thermometer, a nitrogen-supplying tube, a fractional distillation column, and a stirrer, placed was 3,000 parts of N-methyl-2-pyrrolidone (NMP) under a nitrogen environment. Then, 461.7 parts of 1,3-bis(3-aminophenoxy)benzene, 7.1 parts of 3-(3'-(3"-aminophenoxy)phenyl)amino-1-(3'-(3"-aminophenoxy)phenoxy)benzene, 1.9 parts of 3,3'-bis(3"-aminophenoxy) diphenylether (total 1.61 mole), and 171.2 parts (0.69 mole) of siloxanediamine (trade name: LP-7100, manufactured by Shin-Etsu Chemical Co., Ltd.) were added thereto, and the mixture was dissolved uniformly. The mixture was cooled to −10° C. while stirred, and 479.3 parts (2.28 mole) of trimellitic anhydride monochloride (TAC) was added thereto, while the temperature was kept at the same temperature. After stirring at room temperature for 1 hour, 275.9 parts (2.73 mole) of triethylamine was added at a temperature of lower than 10° C.; and the mixture was allowed to react at room temperature for 3 hours, forming a polyamide acid, and additionally at 180° C. for 5 hours, to give a polyamide-imide varnish. The polyamide-imide varnish was poured into methanol for precipitation, and the precipitate was dried under reduced pressure, to give a purified thermoplastic resin (A-1). The molecular weight of the resin obtained was 43,000.

(Preparation of Thermoplastic Resin (A-2))

In a 5-liter polymerization reactor equipped with a thermometer, a nitrogen-supplying tube, a fractional distillation column, and a stirrer, placed was 3,000 parts of N-methyl-2-pyrrolidone (NMP) under a nitrogen environment. Then, 527.6 parts of 1,3-bis(3-aminophenoxy)benzene, 8.1 parts of 3-(3'-(3"-aminophenoxy)phenyl)amino-1-(3'-(3"-aminophenoxy)phenoxy)benzene, 2.2 parts of 3,3'-bis(3"-aminophenoxy) diphenylether (total 1.84 mole), and 395.6 parts (0.46 mole) of siloxanediamine (trade name: X-22-161AS, manufactured by Shin-Etsu Chemical Co., Ltd.) were added thereto, and the mixture was dissolved uniformly. The mixture was cooled to −10° C. while stirred, and 479.3 parts (2.28 mole) of trimellitic anhydride monochloride (TAC) was added thereto, while the temperature was kept at the same temperature. After stirring at room temperature for 1 hour, 275.9 parts (2.73 mole) of triethylamine was added at a temperature of lower than 10° C.; and the mixture was allowed to react at room temperature for 3 hours, forming a polyamide acid, and additionally at 180° C. for 5 hours, to give a polyamide-imide varnish. The polyamide-imide varnish was poured into methanol for precipitation, and the precipitate was dried under reduced pressure, to give a purified thermoplastic resin (A-2). The molecular weight of the resin obtained was 40,000.

(Preparation of Thermoplastic Resin (A-3))

In a 5-liter polymerization reactor equipped with a thermometer, a nitrogen-supplying tube, a fractional distillation column, and a stirrer, placed was 3,000 parts of N-methyl-2-pyrrolidone (NMP) under a nitrogen environment. Then, 494.6 parts of 1,3-bis(3-aminophenoxy)benzene, 7.6 parts of 3-(3'-(3"-aminophenoxy)phenyl)amino-1-(3'-(3"-aminophenoxy)phenoxy)benzene, 2.0 parts of 3,3'-bis(3"-aminophenoxy)diphenylether (total 1.72 mole), and 142.6 parts (0.575 mole) of siloxanediamine (tradename: LP-7100, manufactured by Shin-Etsu Chemical Co., Ltd.) were added thereto, and the mixture was dissolved uniformly. The mixture was cooled to −10° C. while stirred; 706.3 parts (2.3 mole) of 4,4'-oxydiphthalic dianhydride was added thereto while the temperature was kept at the same temperature; and the mixture was allowed to react additionally for 3 hours. The mixture was further allowed to react in the same system at 180° C. for 5 hours, to give a polyimide varnish. The polyamide-imide varnish was poured into methanol for precipitation, and the precipitate was dried under reduced pressure, to give a purified thermoplastic resin (A-3). The molecular weight of the resin obtained was 52,000.

(Preparation of Thermoplastic Resin (A-4))

In a 5-liter polymerization reactor equipped with a thermometer, a nitrogen-supplying tube, a fractional distillation column, and a stirrer, placed was 3,000 parts of N-methyl-2-pyrrolidone (NMP) under a nitrogen environment. Then, 470.6 parts (1.61 mole) of 1,3-bis(3-aminophenoxy)benzene and 171.2 parts (0.69 mole) of siloxanediamine (trade name: LP-7100, manufactured by Shin-Etsu Chemical Co., Ltd.) were added thereto, and the mixture was dissolved uniformly. The mixture was cooled to −10° C. while stirred, and 479.3 parts (2.28 mole) of trimellitic anhydride monochloride (TAC) was added thereto, while the temperature was kept at the same temperature. After stirring at room temperature for 1 hour, 275.9 parts (2.73 mole) of triethylamine was added at a temperature of lower than 10° C.; and the mixture was allowed to react at room temperature for 3 hours, forming a polyamide acid, and additionally at 180° C. for 5 hours, to give a polyamide-imide varnish. The polyamide-imide varnish was poured into methanol for precipitation, and the precipitate was dried under reduced pressure, to give a purified thermoplastic resin (A-4). The molecular weight of the resin obtained was 39,000.

(Preparation of Thermoplastic Resin (A-5))

In a 5-liter polymerization reactor equipped with a thermometer, a nitrogen-supplying tube, a fractional distillation column, and a stirrer, placed was 3,000 parts of N-methyl-2-pyrrolidone (NMP) under a nitrogen environment. Then, 519.2 parts (1.27 mole) of 2,2-bis[4-(4-aminophenoxy)phenyl]propane and 256.7 parts (1.04 mole) of siloxanediamine (trade name: LP-7100, manufactured by Shin-Etsu Chemical Co., Ltd.) were added thereto, and the mixture was dissolved uniformly. The mixture was cooled to −10° C. while stirred; 706.3 parts (2.3 mole) of 4,4'-oxydiphthalic dianhydride was added thereto, while the temperature was kept at the same temperature; and the mixture was allowed to react, to give a polyamic acid. The mixture was further allowed to react in the same system at 180° C. for 5 hours, to give a polyimide varnish. The polyimide varnish was poured into methanol for precipitation, and the precipitate was dried under reduced pressure, to give a purified thermoplastic resin (A-5). The molecular weight of the resin obtained was 50,000.

(Preparation of Thermoplastic Resin Composition for Semiconductor (A-6))

In a 5-liter polymerization reactor equipped with a thermometer, a nitrogen-supplying tube, a fractional distillation column, and a stirrer, under a nitrogen environment, place was 3,000 parts of N-methyl-2-pyrrolidone (NMP). Then, 409.3 parts of 1,3-bis(3-aminophenoxy)benzene, 6.3 parts of 3-(3'-(3"-aminophenoxy)phenyl)amino-1-(3'-(3"-aminophenoxy)phenoxy)benzene, 1.7 parts of 3,3'-bis(3"-aminophenoxy) diphenylether (total 1.43 mole), and 154.3 parts (0.77 mole) of dodecanediamine (manufactured by Wako Pure Chemical Industries Co., Ltd.) were added thereto, and the mixture was dissolved uniformly. The mixture was cooled to −10° C. while stirred, and 463.1 parts (2.20 mole) of trimellitic anhydride monochloride (TAC) was added thereto, while the temperature was kept at the same temperature. After stirring at room temperature for 1 hour, 266.6 parts (2.64 mole) of triethylamine was added at a temperature of lower than 10° C.; the mixture was allowed to react at room temperature (25° C.) for 3 hours, forming a polyamide acid, and additionally at 180° C. for 5 hours, to give a polyamide-imide varnish. The polyamide-imide varnish was poured into methanol for precipitation, and the precipitate was dried under reduced pressure, to give a purified thermoplastic resin (A-6). The molecular weight of the resin obtained was 38,000.

<Preparation of Adhesion Film>

Example 1

The thermoplastic resin (A-1) obtained was dissolved in N-methyl-2-pyrrolidone (NMP) uniformly, and a coupling agent (trade name: KBM403, manufactured by Shin-Etsu Silicones Co., Ltd.) was added in an amount of 3 parts with respect to 100 parts of the thermoplastic resin (A-1), to give a resin composition varnish. The nonvolatile matter in the varnish, as determined after heating at 250° C. for 2 hours, was 40%. The varnish was then coated on both faces of a chemically finished polyimide film (trade name: Upilex SPA, manufactured by Ube Industries, Ltd.); dried at 90° C. for 5 minute and additionally at 250° C. for 10 minutes, forming an adhesive agent layer having a thickness of 25 μm, to give an adhesion film for semiconductor in the three-layer structure.

Example 2

An adhesion film for semiconductor in the three-layer structure was prepared in a similar manner to Example 1, except that the thermoplastic resin (A-1) was replaced with the thermoplastic resin (A-2).

Example 3

An adhesion film for semiconductor in the three-layer structure was prepared in a similar manner to Example 1, except that the thermoplastic resin (A-1) was replaced with the thermoplastic resin (A-3) and the coupling agent used was KBM573 (trade name, manufactured by Shin-Etsu Silicones Co., Ltd.).

Example 4

An adhesion film for semiconductor in the three-layer structure was prepared in a similar manner to Example 1, except that the thermoplastic resin (A-1) was replaced with thermoplastic resin (A-6).

Comparative Example 1

An adhesion film for semiconductor in the three-layer structure was prepared in a similar manner to Example 1, except that the thermoplastic resin (A-1) was replaced with the thermoplastic resin (A-4).

Comparative Example 2

An adhesion film for semiconductor in the three-layer structure was prepared in a similar manner to Example 1, except that the thermoplastic resin (A-1) was replaced with the thermoplastic resin (A-5) and the coupling agent used was KBM573 (manufactured by Shin-Etsu Silicones Co., Ltd., trade name).

<Evaluation of Adhesion Film>

The adhesiveness to lead frame (presence or absence of void generation), adhesive strength to semiconductor element, wire-bonding efficiency, and reflow resistance of the adhesion films for semiconductor obtained in Examples 1 to 4 and Comparative Examples 1 to 2 were evaluated in the following manner. Results are summarized in Table 1.

(Adhesiveness to Lead Frame)

Each adhesion film for semiconductor was punched into 2×3 mm pieces, and an iron-nickel alloy lead frame was bonded onto the adhesive agent layer of each adhesion film for semiconductor by using a calendering press at a compression temperature of 200 or 280° C., a pressure of 3.0 MPa, and a compression period of 0.5 sec. Presence of voids in the adhesion film for semiconductor bonded to the lead frame was evaluated under a stereoscopic microscope.

(Adhesive Strength to Semiconductor Element)

A semiconductor element was mounted on the face of the adhesive agent layer opposite to the adhesive agent layer in contact with the lead frame having an adhesive film prepared in evaluation of the adhesiveness to lead frame, at a compression temperature 200° C. or 280° C., a pressure of 0.5 MPa, and a compression period of 0.5 sec. The adhesive strength to semiconductor element was evaluated by using a push-pull gauge.

(Wire-Bonding Efficiency)

Each adhesion film for semiconductor was punched into pieces in the strip shape; the strips were placed on an iron-nickel-alloy lead frame having a thickness of 0.20 mm so that an inner lead with an interval of 0.2 mm and a width of 0.2 mm may be contacted; and the lead frame and the adhesion film for semiconductor bonded were bonded under the condition of a compression temperature of 230° C., a pressure of 3.0 MPa, and a compression period of 3.0 sec. Then, a semiconductor element was bonded onto the adhesive agent layer-sided face of the lead frame having an adhesive film under the condition of a compression temperature of 200° C., a pressure of 3.0 MPa, and compression period of 3.0 sec. Then, the inner lead of the lead frame having an adhesive film and the semiconductor element were connected to each other with a gold wire at 160° C. by wire bonding, and the adhesion of the wire was evaluated.

(Reflow Resistance)

Figure 5:
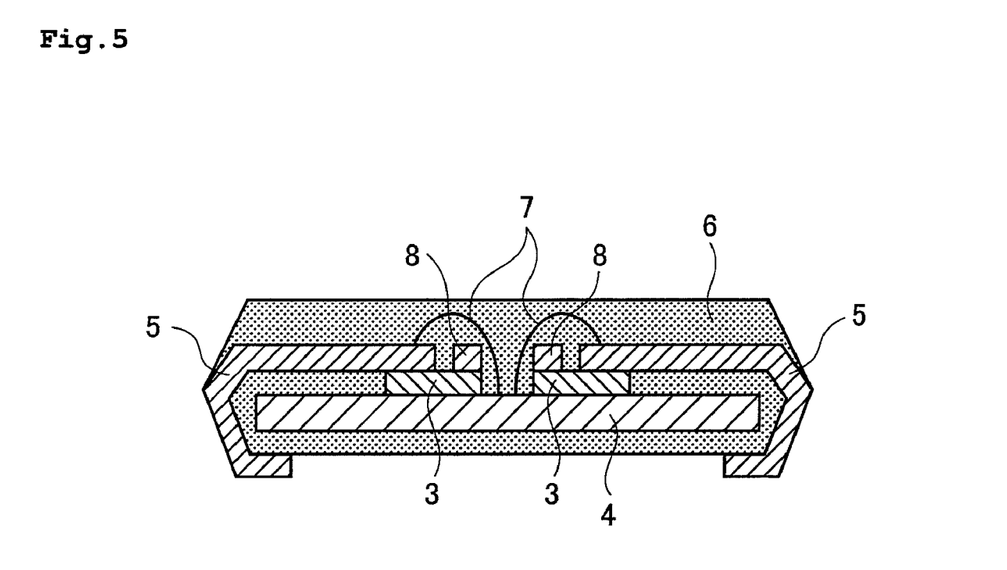
FIG. 5 is a sectional view illustrating the semiconductor device in an embodiment in which a semiconductor element and a lead frame are bonded to each other with the adhesion film for semiconductor according to the present invention.

The lead frame having an adhesive film and a semiconductor element which were mutually wire-bonded in evaluation of the wire-bonding efficiency were sealed with a biphenyl-based epoxy resin molding material (trade name: CEL-9200, manufactured by Hitachi Chemical Co., Ltd.) by transfer molding, to give a semiconductor device (package) like that shown in FIG. 5. The semiconductor device was stored in an environment at 85° C. and 85% RH for 48 hours allowing it to absorb moisture, and then heated in a solder reflow oven at 245° C., and then, presence of package cracking was evaluated. In FIG. 5, 3 represents an adhesion film, 4 represents a semiconductor element, 5 represents a lead frame, 6 represents a sealant, 7 represents a bonding wire and 8 represents a bus bar.

TABLE 1

| Test item | | Example 1 | Example 2 | Example 3 | Example 4 | Comparative Example 1 | Comparative Example 2 |
|---|---|---|---|---|---|---|---|
| Thermoplastic resin | | A-1 | A-2 | A-3 | A-6 | A-4 | A-5 |
| Number of layers of adhesion film | | 3 layers | 3 layers | 3 layers | 3 layers | 3 layers | 3 layers |
| Adhesiveness to lead frame (presence of voids) | 200° C. | Favorable (no void) | Favorable (no void) | Favorable (no void) | Favorable (no void) | Some void generation | Some void generation |
| | 280° C. | Favorable (no void) | Favorable (no void) | Favorable (no void) | Favorable (no void) | Some void generation | Some void generation |
| Adhesive strength to semiconductor element | 200° C. | 18.0 N | 18.5 N | 15.0 N | 14.0 N | 5.0 N | 4.0 N |
| | 280° C. | 20.2 N | 22.1 N | 17.0 N | 16.0 N | 12.1 N | 9.8 N |
| Wire-bonding efficiency | | Favorable (no wire defect) | | | | Some wire defects | Some wire defects |
| Reflow resistance (presence of package cracking) | | Favorable (no package crack) | | | | Many cracks observed | Many cracks observed |

Example 5

In a 1-liter four-necked flask equipped with a thermometer, a nitrogen-supplying tube, a fractional distillation column, placed were 77.4 g of 1,3-bis(3-aminophenoxy)benzene, 1.2 g of 3-(3'-(3"-aminophenoxy)phenyl)amino-1-(3'-(3"-aminophenoxy)phenoxy)benzene, and 0.32 g of 3,3'-bis(3"-aminophenoxy)diphenylether (total 0.270 mole) under a nitrogen environment, and the mixture was dissolved in 483 g of N-methyl-2-pyrrolidone. The solution was then cooled to 0° C. while stirred, and 57.4 g (0.273 mole) of trimellitic anhydride chloride was added thereto. After solubilization of trimellitic anhydride chloride, 32.7 g of triethylamine was added. The mixture was stirred at room temperature for 2 hours, heated to 180° C., and kept at the same temperature for 5 hours, to complete imidation. The reaction solution obtained was poured into methanol, isolating the polymer. The precipitate was dried and redissolved in N-methyl-2- pyrrolidone, and isolated once again by pouring the solution into methanol. Then, the precipitate was dried under reduced pressure, to give a purified polyether amide imide powder. 120 g of the polyether amide imide powder obtained and 3.6 g of a silane-coupling agent (trade name: SH6040, manufactured by Shin-Etsu Chemical Co., Ltd.) were dissolved in 360 g of N-methyl-2-pyrrolidone, to give an aromatic polyether amide imide adhesive agent varnish.

Separately, in a 5-liter four-necked flask equipped with a thermometer, a nitrogen-supplying tube, a fractional distillation column, and a stirrer, placed were 172.4 g (0.42 mole) of 2,2-bis[4-(4-aminophenoxy)phenyl]propane and 153.7 g (0.42 mole) of 4,4'-methylene-bis(2,6-diisopropylaniline) under a nitrogen environment, and the mixture was dissolved in 1,550 g of N-methyl-2-pyrrolidone. The solution was then cooled to 0° C. while stirred, and 174.7 g (0.83 mole) of trimellitic anhydride chloride was added thereto. After solubilization of trimellitic anhydride chloride, 130 g of triethylamine was added. The mixture was stirred at room temperature for 2 hours, heated to 180° C., and kept at the same temperature for 5 hours, to complete imidation. The reaction solution obtained was poured into methanol, isolating the polymer. The precipitate was dried and redissolved in N-methyl-2-pyrrolidone, and isolated once again by pouring the solution into methanol. Then, the precipitate was dried under reduced pressure, to give a purified polyether amide imide powder. 120 g of the polyether amide imide powder obtained and 6 g of a silane-coupling agent (trade name: SH6040, manufactured by Shin-Etsu Chemical Co., Ltd.) were dissolved in 360 g of N-methyl-2-pyrrolidone, to give an aromatic polyether amide imide resin varnish.

The aromatic polyether amide imide adhesive agent varnish thus obtained was then coated on one face of a chemically surface-finished support film having a thickness of 25 μm (polyimide film, trade name: Upilex SGA, manufactured by Ube Industries, Ltd.) to a thickness of 30 μm and dried at 100° C. for 10 minutes and additionally at 300° C. for 10 minutes, to form an adhesive agent layer having a thickness of 8 μm. The adhesive agent layer had a glass transition temperature of 180° C., a 5%-weight-loss temperature of 430° C., and a contact angle with water of 72 degrees. Further, the aromatic polyether amide imide resin varnish thus obtained was coated on the face of the support film opposite to the face in which the adhesive agent layer was formed to a thickness of 25 μm and dried at 100° C. for 10 minutes and at additionally at 300° C. for 10 minutes, to form a resin layer having a thickness of 6 μm. The resin layer had a glass transition temperature of 260° C., a 5%-weight-loss temperature of 421° C., and a modulus of elasticity at 230° C. of 1,700 MPa. In this way, an adhesion film for semiconductor having an adhesive agent layer 12 and a nonadhesive resin layer 13 formed respectively on the faces of a support film 11 similar to that shown in FIG. 2 was prepared.

The adhesion film for semiconductor obtained was then bonded to one face of the organic film-coated copper lead frame under the condition of a temperature of 250° C., a pressure of 8 MPa, and a period of 10 seconds, to give a lead frame having an adhesion film.

The 90° peel strength between the adhesion film and the lead frame in the lead frame having an adhesion film, as determined at 25° C., was 20 N/m, and there was no trouble associated with exfoliation of the adhesion film during transportation. In addition, there was almost no curl in the adhesion film, and the processability during adhesion was favorable.

A semiconductor element was then bonded to the die pad on the other face of the lead frame having an adhesion film; the composite was processed in the wire-bonding and sealing steps, to give a semiconductor device having an adhesion film similar to that in FIG. 3; and there was no problem in any step. The semiconductor element was bonded with a silver paste and hardened by heating at 150° C. for 60 minutes. The wire used in wire bonding was a gold wire, and the wire bonding was performed by heating at 210° C. for 10 minutes. The sealant used in the sealing step was a biphenyl sealant (trade name: CEL9600, manufactured by Hitachi Chemical Co., Ltd.), and the sealant was hardened at a temperature of 175° C. and a pressure of 10 MPa for 3 minutes.

When the adhesion film was peeled off from the lead frame and the sealant at room temperature after the sealing step; the 90° peel strength then was 50 N/m; thus, it was easy to peel off the adhesion film; and there was almost no residual adhesive agent layer of adhesion film on the lead frame and the sealant. In addition, the semiconductor package was divided, to give a semiconductor device similar to that shown in FIG. 4, but the semiconductor device did not cause any particular problem.

What is claimed is:

1. A thermoplastic resin composition for semiconductor, comprising a thermoplastic resin obtained in reaction of an amine component containing an aromatic diamine mixture (A) containing 1,3-bis(3-aminophenoxy)benzene, 3-(3'-(3''-aminophenoxy)phenyl)amino-1-(3'-(3''-aminophenoxy)phenoxy)benzene and 3,3'-bis(3''-aminophenoxy)diphenylether, and an acid component (C).

2. The thermoplastic resin composition for semiconductor according to claim 1, wherein the aromatic diamine mixture (A) contains 3-(3'-(3''-aminophenoxy)phenyl)amino-1-(3'-(3''-aminophenoxy)phenoxy)benzene in an amount of 0.01 to 50 wt % and 3,3'-bis(3''-aminophenoxy)diphenylether in an amount of less than 10 wt % with respect to 100 wt % of the mixture (A).

3. The thermoplastic resin composition for semiconductor according to claim 1, wherein the amine component further includes a siloxanediamine (B).

4. The thermoplastic resin composition for semiconductor according to claim 3, wherein the amine component contains the siloxanediamine (B) in an amount of 0.01 to 80 mol % with respect to 100 mol % of the amine component.

5. The thermoplastic resin composition for semiconductor according to claim 1, wherein the acid component (C) is trimellitic anhydride monochloride.

6. The thermoplastic resin composition for semiconductor according to claim 1, further comprising a coupling agent in an amount of 0.1 to 50.0 parts by weight with respect to 100 parts by weight of the thermoplastic resin.

7. An adhesion film for semiconductor, comprising a support film and an adhesive agent layer made of the thermoplastic resin composition for semiconductor according to claim 1 formed on one face or both faces of the support film.

8. The adhesion film for semiconductor according to claim 7, wherein the contact angle with water of the adhesive agent layer is 50 to 80 degrees.

9. The adhesion film for semiconductor according to claim 7, wherein the glass transition temperature of the adhesive agent layer is 150 to 250° C.

10. The adhesion film for semiconductor according to claim 7, wherein the temperature at which the weight of the adhesive agent layer decreases 5 wt % is 300° C. or higher.

11. The adhesion film for semiconductor according to claim 7, wherein the material of the support film is selected from the group consisting of polyimide, polyamide, polysulfone, polyphenylene sulfide, polyether ether ketone, polyarylate, polycarbonate, polyolefin, polyethylene terephthalate, polyethylene naphthalate, polyamide-imide, polyether sulfone and polyether ketone.

12. The adhesion film for semiconductor according to claim 7, wherein the thickness of the support film is 5 to 200 µm and the thickness of the adhesive agent layer is 1 to 75 µm.

13. The adhesion film for semiconductor according to claim 7, wherein the adhesive agent layer is formed on one face of the support film and a nonadhesive resin layer having a modulus of elasticity of 10 MPa or more at 230° C. is formed on the other face of the support film.

14. A lead frame having an adhesive film, comprising a lead framed and the adhesion film for semiconductor according to claim 7 bonded thereto.

15. A semiconductor device, comprising a lead frame and a semiconductor element bonded mutually by using the adhesion film for semiconductor according to claim 7.

16. A semiconductor device having an adhesion film, comprising:
   a lead frame having an inner lead and a die pad;
   the adhesion film for semiconductor according to claim 7 bonded onto one face of the lead frame;
   a semiconductor element bonded onto the die pad of the other face of the lead frame;
   a wire connecting the semiconductor element and the inner lead to each other; and
   a sealant layer sealing the other face of the lead frame, the semiconductor element and the wire.

17. The semiconductor device having an adhesion film according to claim 16, wherein the die pad and the semiconductor element are bonded to each other via said adhesive agent layer of said adhesion film for semiconductor.

18. A method of producing a semiconductor device, comprising:
   a step of bonding the adhesion film for semiconductor according to claim 7 onto one face of a lead frame having an inner lead and a die pad;
   a step of bonding a semiconductor element onto the die pad of the other face of a lead frame;
   a step of connecting the semiconductor element and the inner lead to each other with a wire by wire bonding;
   a step of sealing the other face of the lead frame, the semiconductor element and the wire with a sealant; and
   a step of separating the adhesion film for semiconductor from one face of the lead frame and the sealant.

19. The method of producing a semiconductor device according to claim 18, wherein the lead frame has multiple patterns each containing the die pad and the inner lead, and further comprises a step of dividing the lead frame into two or more semiconductor devices each having a semiconductor element after the step of sealing or the step of separating the adhesion film for semiconductor.

20. The method of producing a semiconductor device according to claim 18, wherein the die pad and the semiconductor element are bonded to each other by using said adhesion film for semiconductor.

* * * * *